(12) United States Patent
Memis

(10) Patent No.: US 7,279,798 B2
(45) Date of Patent: Oct. 9, 2007

(54) HIGH WIREABILITY MICROVIA SUBSTRATE

(75) Inventor: Irving Memis, Vestal, NY (US)

(73) Assignee: International Business Machines Corporation, Armonk, NY (US)

( * ) Notice: Subject to any disclaimer, the term of this patent is extended or adjusted under 35 U.S.C. 154(b) by 104 days.

(21) Appl. No.: 11/233,572

(22) Filed: Sep. 23, 2005

(65) Prior Publication Data

US 2006/0012054 A1    Jan. 19, 2006

Related U.S. Application Data

(62) Division of application No. 10/715,690, filed on Nov. 18, 2003, now Pat. No. 6,965,170.

(51) Int. Cl.
*H01L 23/52* (2006.01)
(52) U.S. Cl. .................. 257/778; 257/691; 257/776; 257/E23.153
(58) Field of Classification Search ................ 257/778
See application file for complete search history.

(56) References Cited

U.S. PATENT DOCUMENTS

| | | | |
|---|---|---|---|
| 4,016,463 A | 4/1977 | Beall et al. ............ | 361/383 |
| 5,095,407 A | 3/1992 | Kanezawa et al. ........ | 361/414 |
| 5,834,705 A | 11/1998 | Jonaidi .................... | 174/261 |
| 6,348,400 B1 | 2/2002 | Schoenfeld .............. | 438/617 |
| 6,459,161 B1* | 10/2002 | Hirata et al. ............. | 257/786 |
| 2002/0050402 A1* | 5/2002 | Japp et al. ............... | 174/256 |
| 2003/0094685 A1* | 5/2003 | Shiraishi et al. .......... | 257/686 |
| 2004/0183171 A1* | 9/2004 | Breisch et al. ........... | 257/678 |
| 2006/0012054 A1* | 1/2006 | Memis ..................... | 257/778 |

* cited by examiner

*Primary Examiner*—Tu-Tu Ho
(74) *Attorney, Agent, or Firm*—James A. Lucas; Driggs, Hogg & Fry Co., LPA

(57) ABSTRACT

The escape of signals from a semiconductor chip to a printed wiring board in a flip chip/ball grid array assembly is improved by repositioning the signals from the chip through the upper signal layers of the carrier. This involves fanning out the circuit lines through the chip carrier from the top surface that communicates with the chip through the core to the bottom surface where signals exit the carrier to the printed wiring board, which is achieved by making better utilization of the surface area of the signal planes between the core and the chip. The signals are fanned out on each of the top signal planes so that many more of the signals are transmitted through the vias in the core to the bottom signal planes where they can escape outside of the footprint area of the chip, thereby increasing the density of circuits escaping the footprint area.

19 Claims, 2 Drawing Sheets

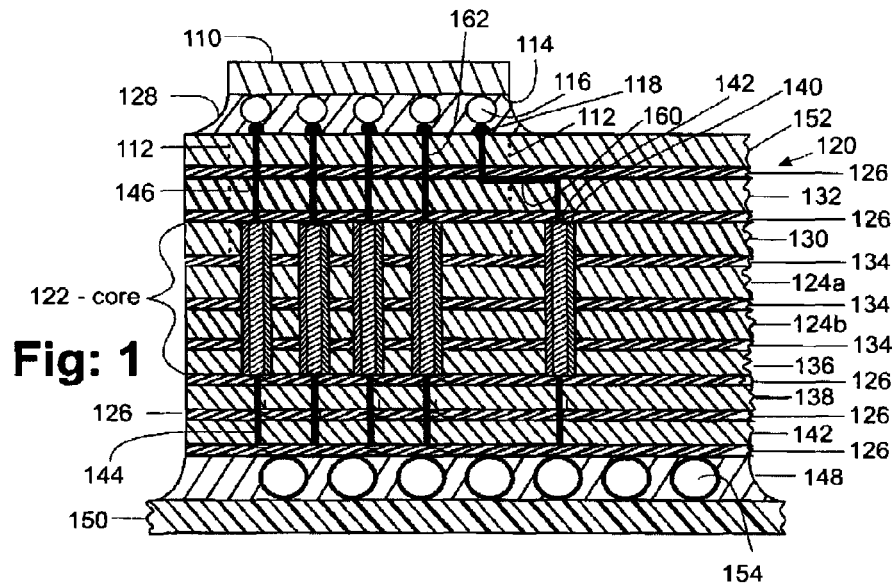
PRIOR ART Fig: 1
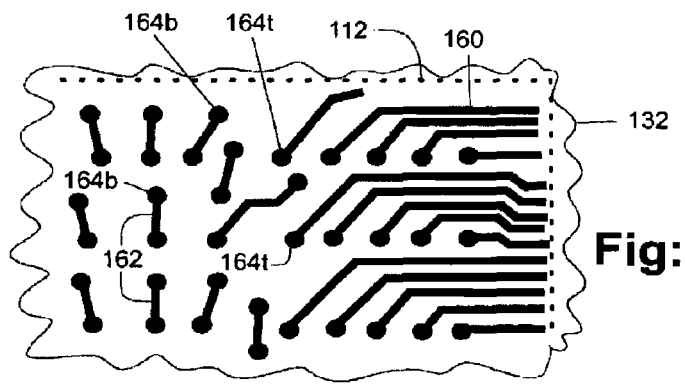
PRIOR ART Fig: 2
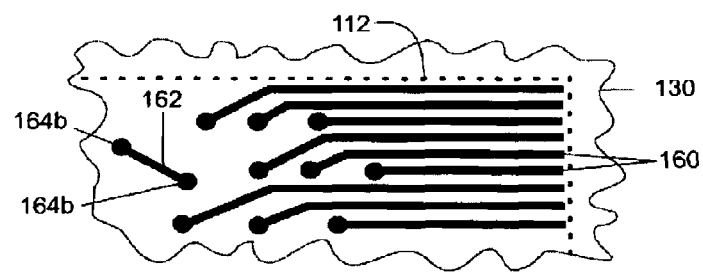
PRIOR ART Fig: 3

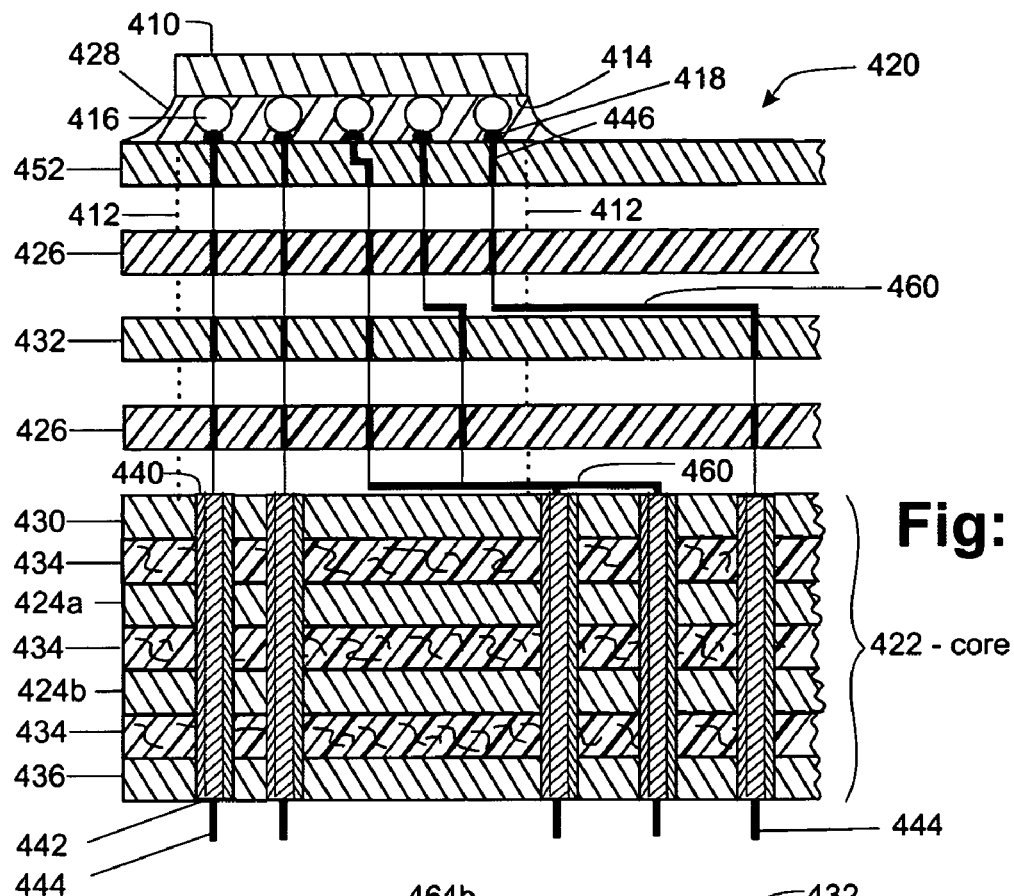
Fig: 4
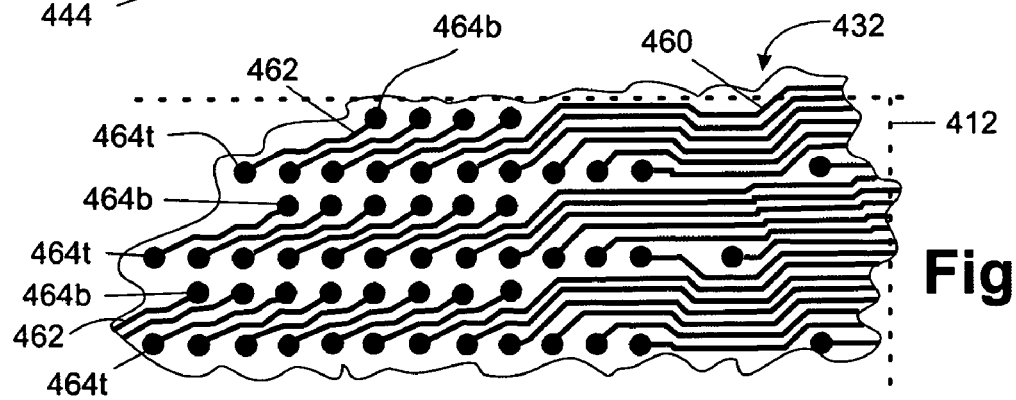
Fig: 5
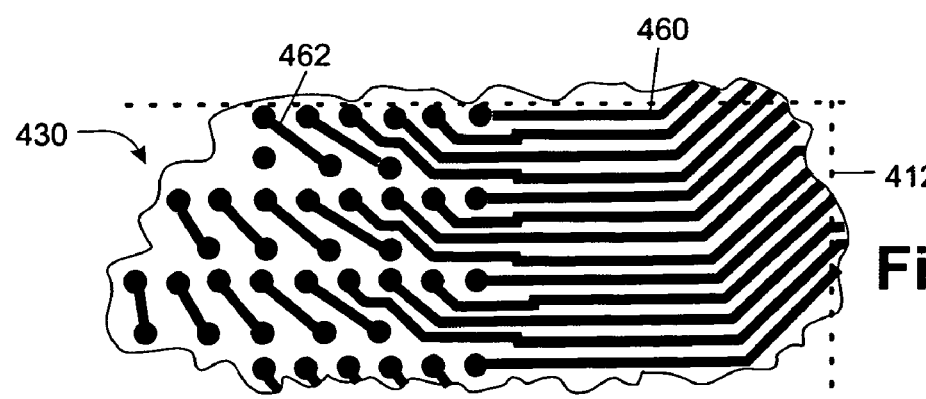
Fig: 6

HIGH WIREABILITY MICROVIA SUBSTRATE

CROSS REFERENCE TO RELATED APPLICATION

This application is a division of patent application Ser. No. 10/715,690, filed Nov. 18, 2003, now U.S. Pat. No. 6,965,170.

FIELD OF THE INVENTION

This invention relates to increasing the density of the signal output from a semiconductor microchip through a chip carrier to a printed wiring board for use in such applications as computers and telecommunication devices. More particularly, the invention relates to the application of this technology to flip chip-ball grid array packaging.

BACKGROUND OF THE INVENTION

The development of increasingly complex integrated circuits with very high input/output (I/O) counts has been coupled with increasing clock rates to compel the development of new manufacturing techniques. In addition, the number of electronic devices that require portability is constantly growing, thereby compelling reductions in system size and weight without adversely affecting reliability. Further adding to this is the advent of the broadband which has greatly increased the requirements for signal transmission in integrated devices and their packaging. Because of these trends, printed circuit board assemblies must rely on increasingly dense interconnection with finer lines, smaller blind or through holes or vias through chip carriers and decreasing thickness of the entire assembly.

One factor in further reducing the size and weight of these components is the ability to electrically couple the chips to the printed circuit board so that the signals from the chip are arrayed to all necessary locations on the board as efficiently as possible.

There are several technologies, such as wire bonding and flip chip mounting, for connecting a chip to a carrier. One type of flip chip mounting, a controlled collapse chip connection (commonly referred to in the industry as C4), is a chip output that is designed so that the chip can be connected through a chip carrier to a printed circuit board. Initially, the C4 technology was limited to ceramic substrates due to the adverse effect that high temperatures required to reflow the tin solder on the chips had on the need to match the thermal expansion of the carrier substrate and that of the silicon chip. However, with the development of low cost dielectrics, such as FR-4 and standard reflow joining time/temperature profiles, this problem is no longer insurmountable. A controlled expansion epoxy encapsulated between the chip and the carrier is used to minimize the cyclic strain on the solder joints induced by thermal expansion mismatch between the chip and the substrate. Without the use of the encapsulant, the thermal cycle fatigue life of the joints would be unacceptable. A typical C4 structure comprises a silicon semiconductor chip provided with a large number of conductive surface pads made from aluminum or copper. A high temperature solder and a eutectic solder serve to join each pad on the chip to a corresponding pad on the ceramic or glass-epoxy substrate. The interconnect is then sealed in an under fill resin such as a controlled expansion epoxy encapsulant. Stresses, such as thermal stress, are absorbed by the two different solders used in the connections. Repairs can be readily made prior to the encapsulation in the under fill resin.

Ideally, it is important to 'escape' 100% of the signals out of a semiconductor chip through the underlying carrier substrate. This typically is achieved in a C4 assembly by making the substrate larger than the chip, and "fanning" the transmission lines, thereby distributing the signal elements over a larger surface area. Also, by employing multiple circuit layers in the substrate, the signals are passed through conductive vias into the multiple layers within the substrate. In C4 technology, the electrical connections are made by soldering each output from the chip to the selected signal layer within the substrate. If the signal output (escape) from the chip is less than 100%, then it becomes necessary to make the planar surface of the chip bigger, or to decrease the number of functional elements, e.g., microprocessor logic or memory, within the chip. Without the ability to use some of these elements, the overall functionality of the system suffers.

C4 area array interconnects provide numerous advantages for the semiconductor chip. Among these is the progression to higher performance, denser integration and reduced chip area along with enhanced reliability. At the macro level, C4 technology reduces product size and weight. Compared to other interconnect technology, the rework of components is facilitated.

The underlying carrier substrate is built up on a core that typically comprises one or two voltage/ground planes that are separated from one another and are bonded into a unitary assembly by a glass-reinforced dielectric. From one to four layers are laminated on each side of this core to provide signal planes, stability and wiring to and from the core. This structure supports chips as well as other active and passive components mounted on the surface of the structure. Microvias pass signals through the carrier substrate to the printed wiring board to which the carrier is coupled by a ball grid array or similar system.

BRIEF DESCRIPTION OF THE INVENTION

One of the objects of the present invention is to permit a reduction in the chip size while maintaining wireability density.

Another object is to make it possible to reduce the number of signal layers in a chip carrier without sacrificing wireability density.

Still another object is to provide a broader I/O scheme through a chip carrier for chip signal elements.

These, as well as other objects and advantages that will become apparent upon a reading of this description, are achieved in an electronic package comprising a semiconductor chip having a given planar surface containing a plurality of solder members, a printed wiring board, and a substrate carrier. The carrier comprises at least one power plane, at least a first top signal plane between the power plane and the chip, and at least one bottom signal plane between the power plane and the printed wiring board. A conductive plane is located above the top signal plane and is in contact with the plurality of solder members on the planar surface of the semiconductor chip. Preferably, it is electrically joined to the chip through a flip chip connection. Circuit lines pass through the planes of the substrate for transmitting signals between the chip and the printed wiring board. The planar surface of the chip forms an imaginary footprint area on the substrate carrier, with the edges defining the planar shape of the chip. At least some of the circuit lines are fanned out on the surface of the top signal plane from the imaginary footprint area to a location on the surface of the plane that that is closer to an edge of the imaginary footprint area or that is outside of the footprint area. From there, the circuit lines pass through the power plane. Typically, the substrate carrier includes a second top signal plane interposed between the first top plane and the conductive plane. This second signal plane is separated from both of these planes by layers of dielectric material. The circuit lines from the conductive plane are fanned out on this second top signal plane, some of the circuit lines extending outside of the footprint area. All of the fanned out circuit lines are then passed through the second top signal plane to the first top signal plane where the fanned out circuit lines that fall within the footprint area are again fanned out on the first signal plane, with at least some of the circuit lines extending outside of the footprint area and others moved closer to an edge of the area. All of the fanned out circuit lines are passed through the at least one power plane to the printed wiring board. It should be noted that additional circuit lines that had not been fanned out on the second signal layer can be fanned out on the first signal layer, at least some of which may extend outside of the footprint area. The rerouted circuit lines that are fanned out beyond the edge of the footprint area on the first or the second signal layers are moved a distance of between about 200 microns and about 400 microns closer to the edge of the footprint area to enable their routing through PTHs in the core and eventual fanout on the bottom signal layers. The substrate carrier commonly includes a core, and the power plane or planes are embedded in the core. In this arrangement, the first top signal plane may form the top of the core.

Further, the invention relates to a sub-assembly and its method of manufacture. The sub-assembly comprises a semiconductor chip and a chip carrier. The carrier comprises a core containing at least one voltage/ground plane and a first top signal plane, separated from one another by a reinforced dielectric layer. A second top signal plane is located above the first signal plane and is separated there from by a dielectric layer. A conductive layer is spaced from the second signal layer by a dielectric layer. This conductive layer forms the top surface of the carrier and is electrically coupled to the semiconductor chip to transmit signals to and from the chip and the printed wiring board through a plurality of conductive pads on the bottom of the chip contacting conductive contacts within the footprint area on the top surface of the conductive layer. The chip has a planar surface defined by the edges of the chip. The area of the planar surface creates an imaginary footprint area on the carrier. Circuit lines or traces electrically conduct the signals from the conductive layer to the second signal layer. These traces or transmission lines on the surface of the second signal layer reroute a first set of circuit lines beyond the footprint of the chip and move a second set of circuit lines closer to the edge of the chip footprint. The traces are connected to microvias extending from the second signal plane down to the top surface of the first signal plane. At least some of the traces that were rerouted on the surface of the second signal plane within the footprint closer to an edge are moved on the surface of the first signal plane to a location beyond the edge of the footprint. The core typically includes a first bottom signal layer separated from at least one voltage/power plane by a reinforced dielectric layer. A plurality of conductive vias extend between the first top and the first bottom signal layers through which the chip signals are transmitted. A second bottom signal layer is separated from the first bottom signal plane by a layer of dielectric material and a bottom conductive layer adapted to be attached to a printed wiring board is spaced from the second bottom signal layer by a dielectric layer. Microvias are coupled to each of the vias to deliver the signals between the bottom of the core through the bottom conductive plane. Typically, the carrier is electrically coupled to the chip through a flip chip connector, such as a C4 connector. The carrier is adapted to be connected to the printed wiring board through a ball grid array.

The chip carrier is prepared by first assembling the core which is composed of at least one voltage/power plane, a first top signal plane forming the top surface of the core and a first bottom signal plane forming the bottom surface of the plane, and a layer of reinforced dielectric material electrically isolating the planes from one another. Thereafter, electrically conducting vias are formed extending vertically through the core from the top surface to the bottom surface. A second top signal layer and a second bottom signal layer are laminated to the core through a dielectric layer. The assembly of the carrier is completed by covering the second top and bottom signal layers with a thin dielectric layer, and laminating a top conductive layer and a bottom conductive layer to the dielectric layers. The semiconductor chip is electrically connected to the top conductive surface through a flip-chip connection such as a C4 connector. The chip has a planar surface with a cross-sectional footprint through which all of the signals pass between the chip and the carrier. The method includes the step of routing certain circuit lines on the second top signal plane away from the footprint area and moving other circuit lines between about 200 microns and 400 microns closer to the edge of the footprint. All of the circuit lines pass through microvias in the second top signal plane to the top surface of the first signal plane where they are moved further out toward the edges of the footprint area with some lines extending beyond the footprint area, and then all of the circuit lines connect by vias in the core to the second bottom signal plane.

The invention also relates to a method for increasing the number of signals passing between the planar surface of a semiconductor chip and a printed wiring board through a chip carrier. The planar surface of the chip creates an imaginary footprint area on a planar top surface of the chip carrier on which the chip is mounted and through which the signals pass between the chip and the chip carrier. The chip carrier includes a core having at least one voltage/ground plane and a first signal plane spaced above and electrically isolated from the voltage/ground plane by a layer of a dielectric material. The carrier further includes a second signal plane electrically isolated from the first signal plane and by a dielectric layer, and a top conductive layer electrically connected to the chip and separated from the second signal plane by a dielectric layer. A first set of signals is routed on the second signal plane to a location outside of the footprint area of the chip. A second set of signals is routed on the second signal plane from within the footprint area to a location closer to an edge of the footprint area. The second set of signals that have been routed closer to the edge of the footprint area on the second signal plane are passed through microvias in the second signal plane to a surface of the first signal plane, and at least some of these are rerouted on the first signal plane to a location outside of an edge of the footprint area. Some of the second set of circuit lines on the first signal plane may also be rerouted closer to an edge of the footprint area. Additional signals on the first signal plane can also be routed to a location closer to an edge of the footprint area and to the outside of the chip footprint area. Typically, the circuit lines on the surface of the first signal plane and on the second signal plane that are moved closer to an edge of the footprint area are moved a distance of between about 200 and about 400 microns in a direction closer to the edge. The signals that are moved closer to the edge of the footprint area pass through the core and are then routed outside the footprint area on the bottom signal planes. The signals normally are routed and rerouted on the first and the second signal planes along conductive transmission lines on a surface of said planes. The method may also include the step of routing at least some of the signals in the top conductive layer to a location outside of the footprint area or closer to an edge of the footprint area, after which these signals are coupled through microvias to the second signal plane.

BRIEF DESCRIPTION OF THE DRAWINGS

FIG. 1 is an elevational view in cross section of a chip assembly according to the prior art;

FIG. 2 is an enlarged view of a portion of the top signal layer of FIG. 1;

FIG. 3 is an enlarged view of a portion of the top signal layer of FIG. 1;

FIG. 4 is an elevational view in cross section of a chip assembly according to the present invention;

FIG. 5 is an enlarged view of a portion of the uppermost signal layer of FIG. 4; and FIG. 6 is an is an enlarged view of a portion of the signal layer immediately below the top signal layer as shown in FIG. 4.

DETAILED DESCRIPTION OF THE INVENTION

A chip is typically made from a material such as silicon which exhibits semiconductive properties. The chip is mounted on a carrier which in turn is mounted on a printed wiring board. The carrier contains a large number of small conductive pathways which, for purposes of the present invention, are referred to as vias passing through the core and microvias passing through the remainder of the carrier for transmitting signals between the chip and the printed wiring board. The carrier contains a core and one or more signal planes above and below the core. The core contains one or more voltage/ground planes as dictated by power consumption requirements, the planes separated from one another by a reinforced dielectric material. One conductive signal layer of copper forms the top of the core and is labeled as FC-1. A second conductive layer forms a second signal layer located above the core and is labeled as FC-2. If additional signal layers are used on the top of the core, they are labeled as FC-3 . . . FC-x with the—x layer being closest to the surface of the carrier that faces the chip. Likewise, the bottom of the core comprises a signal plane labeled as BC-1. Below this is a second signal label, BC-2, possibly followed by one or more additional signal planes with BC-x being located closest to the bottom surface of the carrier facing the printed wiring board. All of the signal planes on the top and bottom of the core are electrically isolated from one another by a thin layer of a dielectric material, typically an unreinforced epoxy resin.

The sub-assembly is produced generally as follows. First, the core is assembled with one, and more typically, two voltage/ground layers, embedded in a suitable substrate material such as a glass fiber-reinforced epoxy resin. The core not only powers the circuits but in addition provides structural strength and rigidity to the carrier so that it can support surface mounted active and passive devices such as semiconductor chips, capacitors, resistors and gates. The top surface of the core comprising a signal plane FC-1 is laminated to the substrate material of the core. In like manner, signal plane BC-1 is laminated to the bottom surface of the substrate material and the layers are subject to pressure and heat to cure the dielectric and to form the completed core. The thickness of the reinforced resin material between each of the signal layers and the voltage/ground layers is generally about 100 microns. Each voltage/ground plane may be about 25 microns thick and comprises copper that has been etched to provide conductive voltage strips that are coupled to the electrical circuits passing vertically through the core. The voltage/ground planes (if more than 1) are separated by an epoxy/glass layer approximately 0.6 mm in thickness. The signal planes FC-1 and BC-1 have a thickness of about 12 microns and are separated from the voltage/ground planes by a reinforced dielectric layer having a thickness of about 100 microns. The core is laminated together under pressure and heat to form a unitary body.

Holes are then drilled through the core to create vias extending from the FC-1 layer through the BC-1. The drilling is done mechanically rather than by laser because laser drilling is ineffective through the resin/glass dielectric layers. Consequently, the diameter of the holes ranges from about 150 microns to about 300 microns rather than about 25 to 150 microns which is possible with a laser. These holes are then plated with a conductive layer of a metal such as copper by suitable means such as electroless, electrolytic or chemical plating or a combination of these processes according to well known techniques. After lamination and via formation, the core can be tested for continuity before further build up.

The next step comprises applying a dielectric film on the two planar surfaces of the signal planes FC-1, BC-1 followed by laminating a second signal layer FC-2 to the top and a second signal layer BC-2 to the bottom of the core. The dielectric films above and below the core typically are made from an epoxy resin that is not reinforced with glass. This enables the two signal layers in the unreinforced dielectric layers to be drilled with a laser or plasma beam to provide holes having a much smaller diameter of about 50 microns. This drilling step is followed by plating the holes with a conductive layer of copper according to established practices.

On top of the FC-2 layer is deposited another unreinforced layer of a dielectric, such as an epoxy resin, laid down as a liquid or a thin film to a thickness of about 40 microns. Laminated to this dielectric film is a C-4 layer of copper, having a thickness of about 16 microns. This layer engages the electrical contacts on the bottom of the chip, with an under fill material serving to securely hold the chip to the carrier. A similar copper layer, called a BGA layer is laminated to an unreinforced dielectric film that is deposited between the BC-2 layer and the printed wiring board. The BGA layer is connected through a dielectric layer and a ball grid array (BGA) to the board. A typical printed wiring board is rectangular in shape having a size many times larger than the chip, perhaps 400 by 500 millimeters.

It should also be understood that the carrier can also be constructed with none of the signal layers being present in the core. Instead, all of the signal planes are spaced above and below the core, and are electrically isolated there from.

The teachings of the prior art are seen in FIGS. 1, 2 and 3 that show, respectively, a vertical cross section of an entire flip chip/ball grid array assembly, a planar view of a small segment of the FC-2 signal plane and a planar view of a small segment of the FC-1 plane. FIGS. 4, 5 and 6 are similar to FIGS. 1, 2 and 3 and show the teachings of the present invention. Each of the four FIGS. 2, 3, 5 and 6 shows several circuit lines on the surface of a signal layer. Normally, the carrier is rectangular or square having a planar dimension approximately 30 by 40 millimeters, with as many as 1,000 of these circuit lines on each signal layer.

Turning now to FIG. 1, there is shown an entire package comprising a semiconductor chip 110, a chip carrier 120 and a printed wiring board 150. The chip 110 is positioned over and is electrically joined to the chip carrier 120 through a C-4 connection or other flip chip attachment. The chip typically is rectangular or square in shape, between about 6 and about 18 millimeters on a side. The profile of the chip creates an imaginary footprint on the chip carrier, as identified by the dotted lines 112. On the bottom surface 114 of the chip is a large array of electrical contacts 116 with some of the contacts located at the edges of the chip and other contacts distributed interiorly of the edges. It is through these contacts that the signals are delivered through the carrier 120 between the chip and the printed wiring board 150.

The chip carrier or microvia substrate 120 is shown with a core 122 containing two power planes V-1 (124a) and V-2 (124b) electrically isolated from one another by a reinforced dielectric material 134 such as fiberglass-reinforced epoxy resin. The top layer of the core 122 is a first signal plane, FC-1 (130). A second signal plane, FC-2 (132), is stacked on top of the first signal plane. Each of these layers is conductive and is preferably made of copper. They are physically and electrically separated from one another by an unreinforced dielectric layers 126. It should be noted that FIG. 1 is not drawn to scale. Although the dielectric layers are shown as being thinner than the conductive planes the dielectrics typically are several times thicker than these planes.

A plurality of vias 140 are shown extending at right angles from the planar surface of FC-1 130 through the core 122 and the first bottom layer BC-1 136 to the second bottom signal layer BC-2 (138). These vias are plated-through holes that are typically filled with a particle filled resin 142 by a method such as that shown in U.S. Pat. No. 6,418,616 B2 owned by the assignee of the present invention. The top of the vias are joined to microvias 146 extending through the FC-2 signal layer to the C4 layer where they are coupled through pads 118 on the C4 layer to the contacts 116 on the bottom of the chip 110. The microvias are formed by a photo etch process or by laser drilling followed by deposition of a conductive copper layer on the walls of the microvias. This photo etch process involves applying a layer of photosensitive dielectric film over the surfaces of a conventional 2-sided board. The film is then photoimaged to define the photovias. This is followed by developing of the photovias after which the surfaces are prepared to enhance adhesion. This then is followed by full panel electroless plating, photoprocessing and etching. The larger vias on the other hand are created by laser drilling or mechanical drilling.

The bottom surface of the core 122 comprises a first bottom signal plane BC-1 136. A second signal plane, BC-2 (138), is beneath the first bottom signal plane. Each of these layers is conductive and preferably is made of copper. They are physically and electrically separated from one another by an unreinforced dielectric material 126 in the same manner as the top signal planes are separated. The bottom of the carrier 120 comprises another conductive copper layer 142 that is called the BGA layer because through it, the carrier 120 is electrically coupled through balls 154 in a ball grid array 148 to the printed wiring board 150. Microvias 144 transfer signals between the bottom of the vias 140 to the ball grid array 148 and thence to the printed wiring board 150.

FIG. 2 shows in detail the typical routing of the circuit lines on the surface of the top signal plane FC-2 132 following current practice. The dotted line 112 shows the chip footprint on the surface of FC-2. A number of circuit lines 160, 162 are shown along with a plurality of conductive pads 164, each of which has a microvia passing vertically through the middle. The horizontal row of pads 164t extends from the C4 layer to the surface of the FC-2 layer 132. The horizontal row of pads 164b goes through the FC-2 layer to the top surface of the FC-1 layer there beneath. The pads are about 80 microns in diameter. The pads 164t in one row are spaced about 300 microns from the pads 164b in the next adjacent horizontal row. Some of the circuit lines 160 'escape' to the outside of the footprint 112 whereas others 162 are angled from the interior of the footprint area toward the edge 112 of the footprint area or parallel to the edge or back toward the interior of the footprint area. Thus, the circuit lines that do not escape remain well within the interior of the footprint. The circuit lines on the FC-2 layer 132 are typically about 25 microns in width, and are spaced about 25 microns apart.

The top surface of a prior art FC-1 layer 130 is shown in FIG. 3. The footprint outline of the chip is shown by the dotted lines 112. Here, the circuit lines are routed by vias through the FC-1 layer and the core and then by microvias through the bottom signal plane and then through the bottom signal and the BGA layer into the printed wiring board. A few more circuit lines 160 'escape' to the outside of the footprint 112. This construction results in an inordinately high concentration of circuit lines vying for space to pass through the vias in the core within the footprint area of the chip resulting in some of the signals and thus the corresponding functions of the chip being interrupted for lack of sufficient room for vias in the core. It should be remembered that the diameter of the core vias is between 150 microns and 300 microns whereas the microvias drilled through the signal planes is on the order of 50 microns. This requires the axial spacing of the vias in the core to be several times greater than the axial spacing of the microvias in the FC-2 layer. The signals that were not able to 'escape' the core and cannot pass through the core are blocked.

The pattern of circuit lines according to the present invention is shown in FIGS. 4, 5 and 6. FIGS. 4-6 are similar to the prior art figures except that in FIGS. 4-6 the circuit lines are fanned out on the top surface of both the FC-2 signal plane 432 and the top surface of the FC-1 signal plane 430. It should also be observed that some fanning out can occur within the C4 layer as shown.

FIG. 4 shows the package assembly from the semiconductor chip 410 and the chip carrier 420 through the core 422, but does not show the bottom signal planes, the printed wiring board or the ball grid interconnect. As before, the chip 410 is positioned over and is electrically joined to the chip carrier 420 through a C-4 connection or other flip chip attachment. The chip footprint on the chip carrier is identified by the dotted lines 412. On the bottom surface 414 of the chip is a large array of electrical contacts 416 with some of the contacts located at the edges of the chip and other contacts distributed interiorly of the edges. These are joined to corresponding conductive pads 418 on the top of the C-4 layer 452. An epoxy under fill 428 anchors the chip interconnects to the C-4 layer 452.

The chip carrier 420 includes a core 422 containing two power planes 424a and 424b electrically isolated from one another by a reinforced dielectric layer 434 such as a fiberglass-reinforced epoxy resin.

A plurality of microvias 446 extend from the C-4 layer 452 through dielectric layer 426 and through the planar surface of FC-2 432 to vias 440 passing through FC-1 layer 430 and the core 422 to microvias going through the BC-2 layer and the BGA layer (not shown) to provide communication between and through various layers of the substrate 420. The dotted lines 412 show the outline of the chip footprint on the surface of the FC-2 layer seen in FIG. 5 and on the surface of the FC-1 layer in FIG. 6.

FIG. 5 shows a number of signal transmission lines 460, 462 along with 6 horizontal rows of conductive pads 464b, 464t, each of which has a microvia passing vertically through the middle of the pad. Each of the microvias 446 descends from the C-4 layer to the surface of the FC-2 layer, and is connected by a circuit line 460 or 462 to a corresponding pad 464b in the next horizontal row which in turn connects to a microvia extending down through the FC-2 layer to the FC-1 layer. Some of the circuit lines 460 'escape' to the outside of the footprint 412 whereas other circuit lines 462 are angled away from the interior of the footprint area toward the edge of the footprint area. These transmission lines on the FC-2 layer are preferably formed by pattern plating.

The circuit lines 462 are connected by vias in the middle of the pads 464 to the top surface of the FC-1 layer 430 shown in FIG. 6. Generally, these lines on the FC-1 layer 430 are about 35 microns in diameter and are spaced about 40 microns apart. Because these lines are thicker than the lines on the FC-2 layer, fewer lines can be routed along the FC-1 surface, and consequently, the line density on the FC-1 layer is less than the density on the FC-2 layer. Accordingly, four circuit lines 460 in each row of pads are shown escaping the footprint area on the FC-1 layer as compared with five or six of the thinner circuit lines on the FC-2 layer. Other lines 462 are routed toward the edges of the footprint but do not end up outside of the footprint. Yet, because the line density is generally lower beneath the edges of the chip than toward the center of the chip, the carrier of the present invention allows more signals to pass between the chip and the printed wiring board. The signals are routed by the vias 440 from the FC-1 layer through the core 422 down to microvias 444 and through the bottom signal planes, the BGA layer and the ball grid array 448 into the printed wiring board, none of which are shown. This rerouting of the circuit lines results in an increase in the area that is available for vias 440 passing through the core, and increases the number of signals that can be routed to the bottom half of the substrate. Accordingly, the number of signal being interrupted for lack of via space in the core is substantially diminished.

Using the teachings of the present invention, as many as 40% to 50% more signals can be wired through the chip carrier without increasing the number of signal layers. Conversely, the number of signal layers that are required in the chip carrier can be reduced with no loss in the number of circuit transmission lines that pass through from the chip to the printed wiring board. Stated another way, as many signals can be passed through the carrier to the printed wiring board using a 9.8 mm² chip as passed through from an 18 mm² chip of the prior art.

Although the invention has been described with particular attention to a chip carrier having 1 signal planes above and 1 such plane below the core, it should be noted that the invention is likewise applicable to chip carriers having two or more signal planes on top of the core and two or more below. Also, it is applicable to other configurations of chip carriers including the 2-2-2, 1-2-1 or other arrangements of signal and voltage/ground planes.

While the invention has been described in combination with specific embodiments thereof, there are many alternatives, modifications, and variations that are likewise deemed to be within the scope thereof. Accordingly, the invention is intended to embrace all such alternatives, modifications and variations as fall within the spirit and scope of the present invention as defined and limited by the appended claims.

What is claimed is:

1. A method for increasing the number of signals passing between a semiconductor chip and a printed wiring board through a chip carrier, wherein the chip has a generally planar shape that creates an imaginary footprint area on a planar top surface of a carrier on which the chip is mounted and through which the signals pass between the chip and the chip carrier, wherein the chip carrier includes a core having at least one voltage/ground plane, a first signal plane spaced above and electrically isolated from the voltage/ground plane by a layer of a dielectric material, a second signal plane separated from the first signal plane and electrically isolated therefrom by a dielectric layer, and a top conductive layer electrically connected to the chip and separated from the second signal plane by a dielectric layer, the method comprising routing a first set of signals on the second signal plane to a location outside of the footprint area of the chip;

routing a second set of signals on the second signal plane from within the footprint area to a location closer to an edge of the footprint area; and passing the second set of signals that have been routed closer to the edge of the footprint area on the second signal plane through microvias in the second signal plane to a surface of the first signal plane, and rerouting at least some of the second set of the circuit lines on the first signal plane to a location outside of an edge of the footprint area.

2. The method according to claim 1 comprising rerouting at least some other of the second set of circuit lines on the first signal plane closer to an edge of the footprint area.

3. The method according to claim 2 further including the step of routing additional signals to a location on the first signal plane outside of the chip footprint area.

4. The method according to claim 3 including passing all of the routed and rerouted signals through the carrier core to the printed wiring board.

5. The method according to claim 4 wherein the signals are routed and rerouted on the first and the second signal planes along conductive transmission lines on a surface of said planes.

6. The method according to claim 1 further including the step of routing at least some of the signals in the top conductive layer to a location closer to an edge of the footprint area, and thereafter coupling these signals through microvias to the second signal plane.

7. The method according to claim 1 wherein the circuit lines on the surface of the first signal plane and on the second signal plane that are moved closer to an edge of the footprint area are moved a distance of between about 200 and about 400 microns.

8. An electronic package comprising:
a) a semiconductor chip having a given planar surface containing a plurality of solder members through which signals are passed;
b) a printed wiring board;
c) a substrate carrier having 1) at least one power plane,
2) a first top signal plane between the at least one power plane and the chip, and at least one bottom signal plane between the power plane and the printed wiring board,
3) a conductive plane between the first top signal plane and the semiconductor chip, said conductive plane in contact with the plurality of solder members on the planar surface of the chip,
4) a second top signal plane between the first top signal plane and the conductive plane, separated from both planes by a layer of dielectric material, wherein circuit lines are fanned out on the second top signal plane, some of them extending outside of the footprint area, and the fanned out circuit lines are then passed through the second top signal plane to the first top signal plane wherein any fanned out circuit lines that are within the footprint area are further fanned out on the first top signal plane whereby at least some of them extend outside of the footprint area, and all of the fanned out circuit lines are passed through the at least one power plane to the printed wiring board; and
5) circuit lines passing along and through the top signal plane for transmitting signals between the chip and the printed wiring board,
    wherein the planar surface of the chip forms an imaginary footprint area on the substrate carrier, with edges defining the planar shape of the chip, and at least some of the circuit lines are fanned out on the surface of said first top signal plane from the imaginary footprint area toward an edge of the footprint area before passing through the at least one power plane.

9. The electronic package according to claim 8 wherein additional circuit lines are fanned out on the first signal plane that are fanned out toward the edges of the footprint area on the second signal plane.

10. The electronic package according to claim 8 wherein the circuit lines are fanned out on the second signal plane a distance of at least between about 200 microns and about 400 microns toward the edges of the footprint area, and the circuit lines are fanned out on the first top signal plane a distance of between about 200 microns and about 400 microns toward the edges of the footprint area.

11. The electronic package according to claim 8 wherein the substrate carrier includes a core, and the at least one power plane is embedded in the core.

12. The electronic package according to claim 11 wherein the first top signal plane forms the top of the core.

13. The electronic package according to claim 8 wherein the substrate carrier is electrically joined to the chip through a flip chip connection.

14. A method of making an electronic package composed of a semiconductor chip, a printed wiring board, and a chip carrier, wherein the chip carrier is coupled to the printed wiring board to transmit signals between said chip and said board, said chip having a planar surface facing the carrier through which the signals are transmitted, said planar surface defined by edges delimiting an imaginary chip footprint area on the carrier the method comprising the steps of
    a) forming a carrier core, said core composed of at least one voltage/power plane between a first top signal plane comprising the top surface of the core and a first bottom signal plane comprising the bottom surface of the core, and a dielectric material electrically isolating each of the planes from one another;
    b) forming electrically conducting vias vertically through the core joining circuit lines on the first top surface to circuit lines on the first bottom plane;
    c) laminating a second top signal plane on top of the first signal layer separated there from by a layer of dielectric material, and laminating a second bottom signal plane to the bottom of the first bottom signal layer, separated therefrom by a dielectric layer;
    d) routing a first set of circuit lines on the second top signal plane to a location outside of the footprint area on the carrier, and routing a second set of circuit lines on the second top signal plane in closer proximity to the edges of the footprint area;
    e) forming microvias through the second top signal plane to the top of the vias in the core, and forming microvias extending from the bottom of the vias through the second bottom signal plane to the bottom conductive layer;
    f) completing the assembly of the carrier by covering the second top signal plane with a layer of dielectric material, covering the second bottom signal plane with a layer of dielectric material, laminating the second top signal plane to a top conductive layer, and laminating the second bottom signal plane to a bottom conductive layer;
    g) forming microvias from the top conductive layer down to the second top signal plane and forming microvias from the bottom conductive layer up to the second bottom signal plane;
    h) electrically coupling the semiconductor chip to the top conductive surface of the carrier; and
    i) electrically coupling the printed wiring board to the bottom conductive surface, whereby at least the first set of circuit lines that are routed on the top signal planes pass through the core outside of the footprint area, and at least some of the second set of circuit lines pass through the footprint in close proximity to the edges of the footprint area.

15. The method according to claim 14 including routing certain circuit lines on the top surface of the second top signal plane out of the footprint area and other circuit lines from within the footprint area to a location that is closer to the edges of the footprint area.

16. The method according to claim 14 including the additional step of routing circuit lines on the first signal plane away from the footprint area.

17. The method according to claim 14 wherein the chip carrier is electrically coupled to the chip through a flip-chip connection.

18. The method according to claim 14 wherein the carrier is electrically coupled to the printed wiring board through a ball grid array.

19. The method according to claim 14 wherein the circuit lines on the first top signal plane and the circuit lines on the second top signal plane that are routed closer to an edge of the footprint area are moved a distance on the respective surface of between about 200 microns and about 400 microns closer to the edges of the footprint area.

* * * * *